United States Patent [19]

Kouba

[11] Patent Number: 4,725,986
[45] Date of Patent: Feb. 16, 1988

[54] FET READ ONLY MEMORY CELL WITH WORD LINE AUGMENTED PRECHARGING OF THE BIT LINES

[75] Inventor: Daniel J. Kouba, Manassas, Va.

[73] Assignee: International Business Machines Corporation, Armonk, N.Y.

[21] Appl. No.: 534,035

[22] Filed: Sep. 20, 1983

[51] Int. Cl.⁴ ............................................. G11C 17/00
[52] U.S. Cl. .................................... 365/203; 365/104
[58] Field of Search ............................... 365/104, 203

[56] References Cited

U.S. PATENT DOCUMENTS

| | | |
|---|---|---|
| 3,866,186 | 2/1975 | Suzuki . |
| 4,006,469 | 1/1977 | Leehan et al. . |
| 4,151,603 | 4/1979 | Gladstein . |
| 4,208,727 | 6/1980 | Redwine et al. ................... 365/104 |
| 4,240,151 | 12/1980 | Kawagoe ............................ 365/104 |
| 4,262,341 | 4/1981 | Mogi et al. . |
| 4,375,600 | 3/1983 | Wu . |
| 4,389,705 | 6/1983 | Sheppard . |
| 4,413,330 | 11/1983 | Chao et al. . |

OTHER PUBLICATIONS

IBM Technical Disclosure Bulletin–vol. 15, No. 8, Jan. 1973, pp. 2371–2372.
IBM Technical Disclosure Bulletin–vol. 16, No. 5, Oct. 1973, p. 1642.
IBM Technical Disclosure Bulletin–vol. 25, No. 3A, Aug. 1982, pp. 1070–1072.

*Primary Examiner*—James W. Moffitt
*Attorney, Agent, or Firm*—John E. Hoel

[57] ABSTRACT

An FET read only memory cell circuit is disclosed wherein word lines serve to augment the precharging of the bit lines. If an FET read only memory site is preprogrammed as a binary one, for example, then when its word line is pulsed, the bit line will be insured to have an affirmatively high potential, representing a binary one state. This improves the reliability of the operation of the circuit by minimizing the effects of charge leakage from the bit line.

8 Claims, 6 Drawing Figures

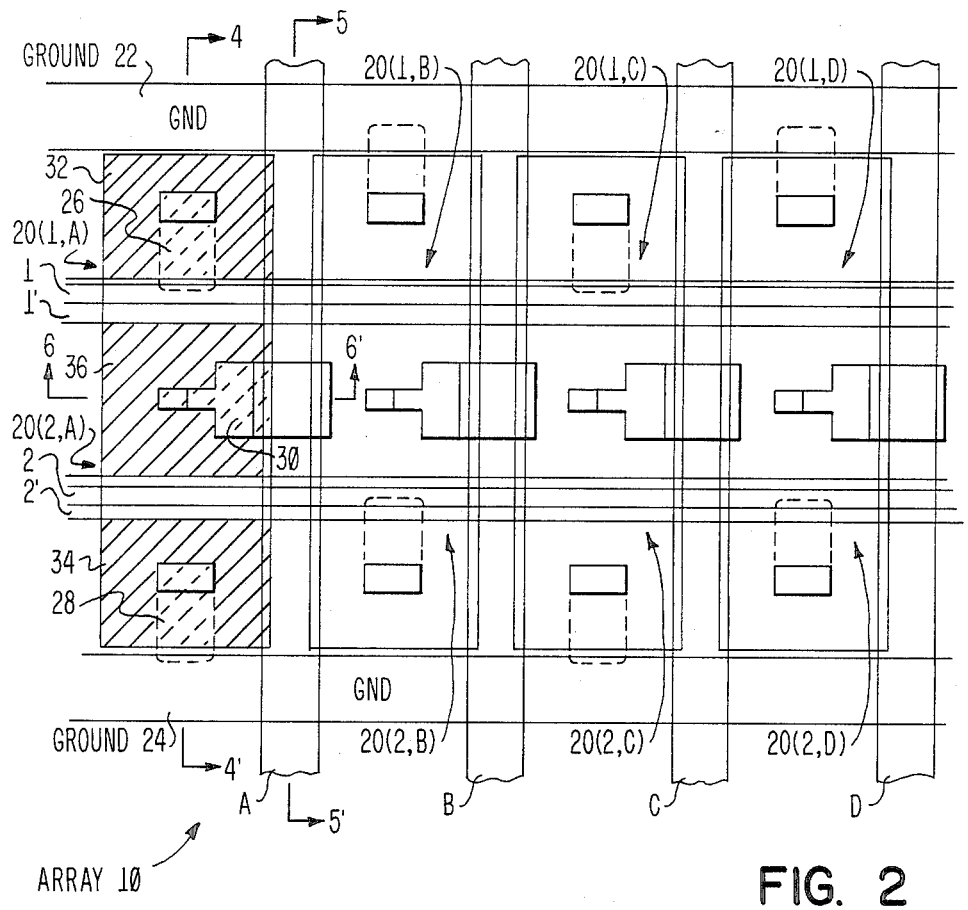
FIG. 2
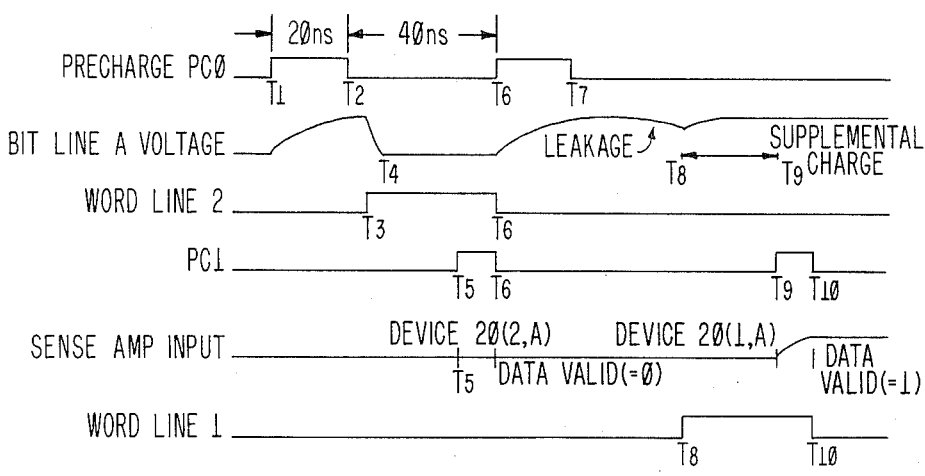
FIG. 3 TIMING DIAGRAM

SEC 4-4'
(OF FIG. 2)

SEC 5-5'
(OF FIG. 2)

SEC 6-6'
(OF FIG. 2)

FET READ ONLY MEMORY CELL WITH WORD LINE AUGMENTED PRECHARGING OF THE BIT LINES

FIELD OF THE INVENTION

The invention disclosed broadly relates to memory circuits and more particularly relates to FET semiconductor read only memory circuits.

BACKGROUND OF THE INVENTION

Many FET read only memory circuits have been described in the prior art, wherein a binary one or a binary zero is selectively stored at a particular location at the time of fabrication of the circuit, by permanently altering the conductivity of the FET storage device. When large arrays of such read only memory devices are connected in parallel to a charging node, significant problems can arise due to the leakage of charge from the node during intervening quiescent periods between the precharge stage and the conditional discharge stage. If significant quantities of charge have bled away from a node which is to be sensed for its state to indicate whether a binary one or a binary zero was stored at the accessed location, then the result of that binary sensing can be ambiguous.

OBJECTS OF THE INVENTION

It is therefore an object of the invention to provide a more reliable operation for an FET read only memory circuit.

It is still another object of the invention to provide a more reliable operation for FET read only memory circuits having large numbers of storage devices connected to a charging node or a sensing node.

It is yet a further object of the invention to provide an improved FET read only memory circuit having a more compact layout than prior art circuits, while also providing for a more reliable operation.

SUMMARY OF THE INVENTION

These and other objects, features and advantages of the invention are accomplished by the FET read only memory cell circuit disclosed herein. An FET read only memory cell circuit is disclosed wherein word lines serve to augment the precharging of the bit lines. If an FET read only memory site is preprogrammed as a binary one, for example, then when its word line is pulsed, the bit line will be insured to have an affirmatively high potential, representing a binary one state. This improves the reliability of the operation of the circuit.

DESCRIPTION OF THE FIGURES

These and other objects, features and advantages of the invention will be more fully appreciated with reference to the accompanying figures.

FIG. 2 is a plan view of the layout of the array of FET read only memory storage cells employed in the circuit shown in FIG. 1.

FIG. 3 is a timing diagram showing the operation of the invention.

DISCUSSION OF THE PREFERRED EMBODIMENT

Figure 1:
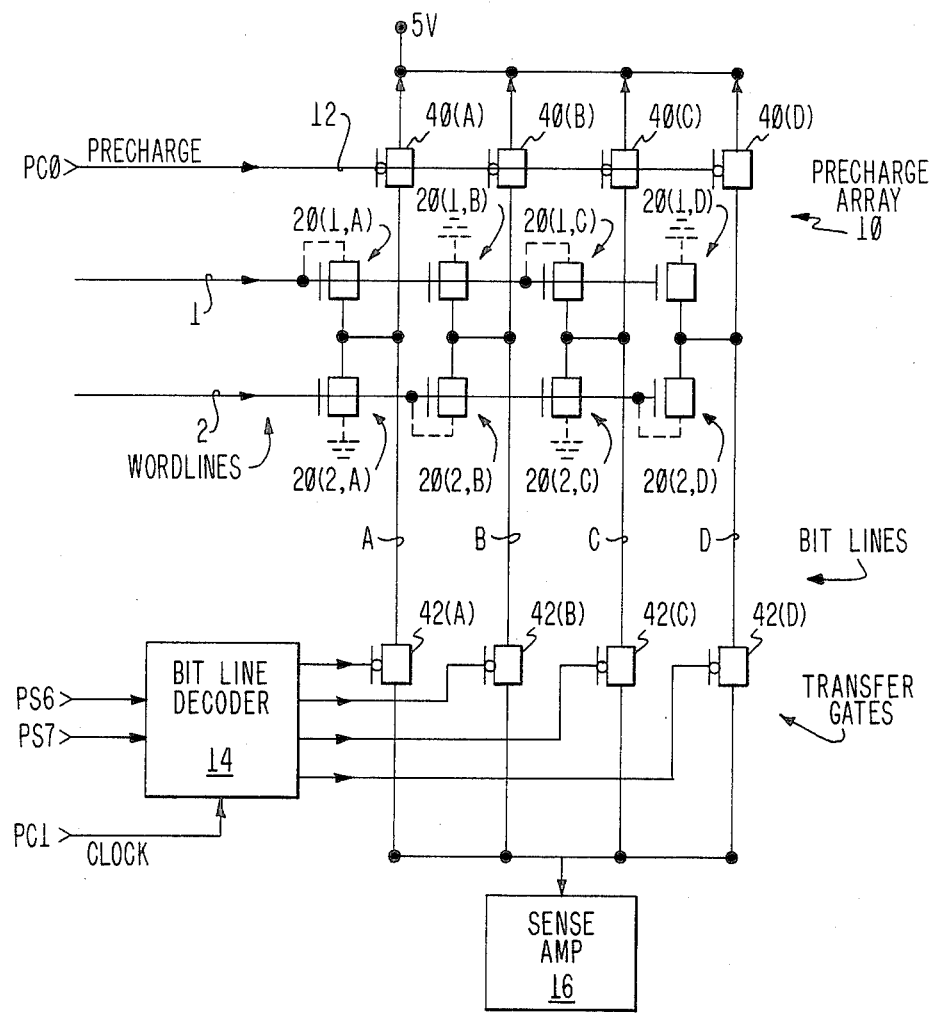
FIG. 1 is an overall circuit schematic diagram of the FET read only memory cell circuit with word line augmented precharging of the bit lines.

FIG. 1 is a circuit schematic diagram of the invention. An array 10 of FET read only memory cells is accessed by a plurality of word lines 1 and 2 disposed in a horizontal direction and a plurality of bit lines A, B, C and D disposed in a vertical direction as shown in FIG. 1. The convention adopted here for naming the FET read only memory devices in the array 10 will be to designate each device as having the reference numeral 20 followed by the identity of the word line and the bit line which access that array device, expressed within parentheses. For example, the FET read only memory array device 20(1,A) refers to the FET array device in the array 10 which is accessed by the word line 1 and the bit line A. Although the array 10 shown in FIG. 1 contains eight devices connected to two word lines and four bit lines, the principle of the invention can be applied to any size read only memory array.

The bit lines A, B, C and D are respectively connected through FET devices 40(A), 40(B), 40(C) and 40(D) to a positive drain voltage of five volts, for example. A precharge signal PC0 is applied to the gates of the precharge FET devices 40(A), 40(B), 40(C) and 40(D) in accordance with the precharge waveform shown in the timing diagram of FIG. 3. This applies a positive precharge potential to the bit lines A, B, C and D, respectively, as is shown by the bit line voltage waveform in the timing diagram of FIG. 3.

The FET devices described herein are N channel FET devices. Enhancement mode N channel FET devices require a positive potential difference between the gate and the source in order to conduct current between the drain and the source thereof. N channel enhancement mode FET devices are the type of devices to be employed in the array 10.

The threshold voltage for an FET device can be adjusted by means of ion implantation or other well-known techniques so that the potential difference between the gate and the source of the FET device can be selectively made more positive in the case of enhancement mode FET devices, or more negative in the case of depletion mode FET devices. If the threshold voltage of an FET device is selectively adjusted so that conduction starts when there is no potential difference between the gate of the device and its source, then such a device is referred to as a zero threshold or "natural" threshold FET device.

When current is conducted from the drain to the source of an FET device, the electric potential at the source is reduced from the electric potential at the drain of the device by a quantity substantially equal to the threshold voltage for the device. In order to minimize the reduction in the potential of the bit lines A, B, C and D when they are precharged, the precharge FET devices 40(A), 40(B), 40(C) and 40(D) are fabricated as "natural" threshold FET devices.

The FET array devices in the array 10 are selectively fabricated to either discharge the respective bit line to which the array device 10 is connected or alternately to not discharge the respective bit line to which it is connected. The convention adopted herein attributes the storage of a binary zero to an FET array device in the array 10 which discharges its bit line. Alternately, the convention herein attributes a binary one to an FET array device in the array 10 which does not discharge its bit line when accessed. The FET array device 20(2,A) has been fabricated to represent a binary zero so that it will discharge its bit line A, when its word line 2 attempts to access it. This is shown in the timing diagram of FIG. 3. Alternately, the device 20(1,A) was fabricated to represent a binary one, and therefore it will not discharge its corresponding bit line A when a signal is received on its word line 1. This is also shown in the timing diagram of FIG. 3.

The sense amplifier 16 determines whether a binary zero or a binary one was stored at the FET array device in the array 10 which was accessed, by sensing the residual potential on the corresponding bit line. The transfer gates 42(A), 42(B), 42(C) and 42(D) respectively connect the bit lines A, B, C and D to the sense amplifier 16. The bit line decoder 14 has two inputs PS6 and PS7 which are decoded when the clock PC1 turns on, so that the decoder 14 outputs an enabling signal to only one of the transfer gates 42(A), 42(B), 42(C) or 42(D) corresponding to the FET array device in the array 10 which is desired to be accessed. Since it is preferred to avoid diminishing the magnitude of the residual potential on a bit line as it passes through its corresponding transfer gate, the transfer gates 42(A), 42(B), 42(C) and 42(D) are "natural" threshold FET devices. When an enabling signal from the bit line decoder 14 is applied to the gate of the transfer gate FET device 42(A), for example, the residual potential on the bit line A will be transferred to the sense amplifier 16 without a diminution in amplitude. The relationship between the time which the decoder clock PC1 turns on and the signal input to the sense amplifier 16, is shown in the timing of FIG. 3. In accordance with the invention, the FET array devices in the array 10 are selectively fabricated to permanently represent a binary one, by selectively connecting the source/drain path of the array device between its corresponding bit line and its corresponding word line. This is shown for the FET array devices 20(1,A), 20(1,C), 20(2,B) and 20(2,D). Alternately, an FET array device in the array 10 can be selectively fabricated to represent a binary zero by connecting the source/drain path of the device between its corresponding bit line and ground potential. This is shown for the FET array devices 20(1,B), 20(1,D), 20(2,A) and 20(2,C).

For those FET array devices in the array 10 which are fabricated to represent a binary one, for example the FET device 20(1,A), the reason for connecting the source/drain path between the corresponding bit line A and the corresponding word line 1, is to provide an additional quantity of charge from the word line during the interval when the word line signal is present, which can pass through the source/drain path of the FET array device and which can be applied to the bit line A so as to replenish any charge on the bit line A which may have inadvertently leaked off subsequent to the precharging of that bit line. This is shown for example in the timing diagram of FIG. 3 where it is seen that the bit line A will be precharged during the interval between T6 and T7 and that after this interval, the voltage on the bit line A is seen to gradually decrease. If the voltage on the bit line A were allowed to sufficiently decrease before the sense amplifier 16 were enabled to sample its magnitude, then the sense amplifier 16 might not be able to distinguish between the relatively higher voltage corresponding to a binary one and the relatively lower voltage corresponding to a binary zero. As is seen in the timing diagram of FIG. 3, when the word line 1 has its enabling signal turn on at time T8, a supplemental current will begin to flow from the word line 1 through the source/drain path of the FET array device 20(1,A) to the bit line A, thereby raising the potential of the bit line A to the desired higher potential representing a binary one. Thereafter, at the later time T9 when the clock signal PC1 enables the bit line decoder 14 and when the transfer gate 42(A) turns on, the amplitude of the signal input to the sense amplifier 16 rises to a fully positive voltage representing a binary one, as is desired. The timing diagram of FIG. 3 illustrates this sequence. Thus, in accordance with the invention, an unambiguous positive voltage signal can be applied by the bit line A to the sense amplifier 16 in spite of inadvertent leakage of charge from the bit line A, by virtue of the supplementary charge provided from the word line 1 through the FET array device 20(1,A) to the bit line.

When an array device in the array 10 has been fabricated to represent a binary zero, as for example the FET array device 20(2,A), a positive going signal on the word line 2 will render the FET array device conductive, thereby providing a current path between the bit line A and ground potential so as to discharge the bit line A. Thereafter, when the bit line decoder 14 enables the transfer gate 42(A), a relatively low potential representing a binary zero will be applied to the sense amplifier 16. This can be seen in the waveforms of the timing diagram of FIG. 3. At the time T1 the precharge signal PC0 on line 12 turns on and the voltage on the bit line A rises until the precharge signal PC0 turns off at time T2. Thereafter, at time T3, the word line 2 has its signal turned on and the charge stored on the bit line A is then conducted through the FET array device 20(2,A) to ground potential so that the voltage on the bit line A returns to ground potential at time T4, as is shown in the timing diagram of FIG. 3. Thereafter, at time T5 when the clock PC1 turns on, thereby causing the bit line decoder 14 to turn on the transfer gate 42(A), the ground potential on the bit line A is transferred to the sense amplifier 16 and a binary zero value is read.

The structure of the FET array devices in the array 20 is shown to better advantage in the sequence of FIGS. 2, 4, 5 and 6. FIG. 2 is a layout diagram of the FET array devices in the array 10 which are shown in the electrical schematic diagram of FIG. 1. Detailed cross-sectional views of the FET array devices 20(1,A) and 20(2,A) are shown in the cross-sectional views of FIGS. 4, 5 and 6.

The entire circuit shown in FIG. 1 can be fabricated on a single integrated circuit chip. The integrated circuit is formed on a P-type silicon substrate 31. As is seen in the cross-sectional diagram of FIG. 4, the FET array devices 20(1,A) and 20(2,A) are formed by the N-type diffusions 32, 36 and 34 which are formed in the P-type substrate 31. The FET array devices to be formed are metal oxide semiconductor (MOS) FET devices wherein polycrystalline silicon gate electrodes 1' and 2' are formed on top of a thin gate insulator layer 50 and then the N-type doped regions 32, 36 and 34 are formed in the P-type substrate 31 by either diffusion or ion implantation techniques, as are well-known in the prior art. In the preferred embodiment, two additional levels of metal interconnection lines which are mutually orthogonal and insulated from each other are applied above the layer of polycrystalline silicon within which has been formed the gate electrodes 1' and 2'. After suitable interconnections have been patterned and interlevel via connections have been made, the entire assembly is encapsulated in an insulating medium 35 which can be silicon dioxide, polyimide, or other suitable insulating medium.

Figure 4:
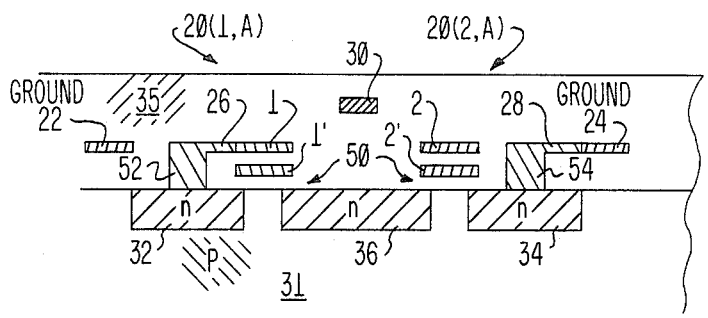
FIG. 4 is a cross-sectional view along the section line 4—4' of FIG. 2.
Figure 5:
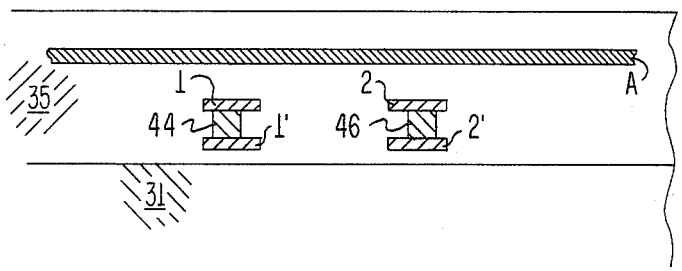
FIG. 5 is a cross-sectional view along the section line 5—5' of FIG. 2.
Figure 6:
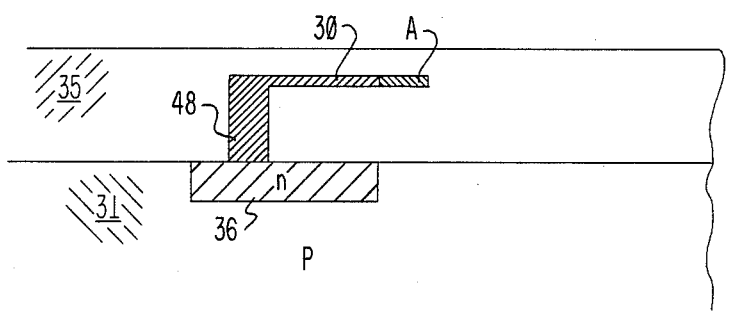
FIG. 6 is a cross-sectional view along the section line 6—6' of FIG. 2.

FIG. 4 is the cross-section along the section line 4—4' of FIG. 2 and shows that the word line 1 is parallel to and lies above the gate electrode 1' for the FET array device 20(1,A). The cross-sectional view in FIG. 5 along the section line 5—5' of FIG. 2 shows that the polycrystalline silicon gate electrode 1' is electrically connected by means of the interlevel via connection 44 to the word line 1. Thus it is seen that the word line 1 is electrically connected to the polycrystalline silicon gate electrode 1' of the FET array device 20(1,A). In a similar manner, the word line 2 is a metal line which is part of the first level metal layer of which the word line 1 is a member, lies parallel to and above the polycrystalline silicon gate electrode 2' of the FET array device 20(2,A). The cross-sectional view of FIG. 5 shows that polycrystalline silicon gate electrode 2' is electrically connected by means of the interlevel via connection 46 to the word line 2. The ground lines 22 and 24 are also patterned lines which are parallel to the word lines 1 and 2 and are also members of the first level metal layer out of which the word lines 1 and 2 are also formed.

The central N-type doped region 36 which is shared by both devices 20(1,A) and 20(2,A), is connected by means of the interlevel metal via connection 48 and the tab 30 to the bit line A.

In accordance with the invention, since a binary one representation is desired to be fabricated into the FET array device 20(1,A), the interlevel metal via connection 52 which contacts the N-type doped region 32, is selectively connected by means of the tab 26 to the word line 1. The tab 26 is formed out of the first level metal layer from which the word line 1 was formed. As was described above, after the precharge signal PC0 has turned off at time T7, charge begins to leak off of the bit line A and this reduced potential is applied over the tab 30 and the via interconnection 48 to the N-type doped region 36. Then at time T8 when the word line 1 goes positive, the positive going word line signal is applied by the tab 26 and the via interconnection 52 to the N-type doped region 32. Since the positive going word line signal on the word line 1 is also applied by means of the via 44 to the gate electrode 1', the N-type region 32 behaves as a drain and the N-type region 36 behaves as the source of the FET array device 20(1,A), so that a supplementary current is conducted from the word line 1 and the N-type region 32 to the N-type region 36 and the bit line A, thereby compensating for the lost charge on the bit line A, as described above.

Further in accordance with the invention, since a binary zero representation is desired to be fabricated for the FET device 20(2,A), the interlevel metal via connection 54 connecting to the N-type doped region 34 is selectively connected by means of the tab 28 to the ground line 24. The tab 28 is formed out of the same first level metal layer as was the ground line 24. Thus, at time T2 of the timing diagram of FIG. 3, the bit line A has a positive potential which is applied to the N-type region 36 and the ground potential of the ground line 24 is applied to the N-type region 34. Then, at the time T3 the potential of the word line 2 goes positive and this is applied through the via 46 to the gate electrode 2' of the array device 20(2,A). Since the N-type region 36 is more positive than the N-type region 34, the N-type region 36 behaves as a drain and the N-type region 34 behaves as a source so that current flows from the bit line A through the N-type region 36 to the N-type region 34 and then to the ground line 24, thereby discharging the bit line A, as described above.

It is seen from the layout diagram of FIG. 2, that the array 10 of FET read only memory devices is quite compact and represents a very high storage density. This increase in storage density is achieved in part by the connection of the source/drain path between the word line and the bit line for those FET array devices storing a binary one representation. In the prior art, those FET array devices representing a binary one have their source/drain paths connected between the bit line and the five volt drain potential for the chip. This required running additional drain voltage lines through the array in order to enable such connections to be selectively made. The addition of extra drain voltage lines increased the overall area which had to be occupied by an array of a given information content. This requirement is completely eliminated by the invention disclosed herein, there being no necessity to run extra drain voltage lines through the array.

Although the preferred embodiment described herein uses N channel FET devices and has provided for "natural" threshold FET devices as the precharge devices 40(A) through 40(D) and has provided for "natural" threshold devices for the transfer gates 42(A) through 42(D), other types of FET devices and technologies can be employed within the scope of the invention disclosed herein. The precharge FET devices 40(A) through 40(D) can be enhancement mode devices, for example. The transfer gate devices 42(A) through 42(D) can also be enhancement mode devices. Still further, the invention disclosed herein can also be embodied in complementary MOSFET devices, for example using P channel FET devices for the precharge FET devices 40(A) through 40(D) and N channel FET array devices for the array 10 and for the transfer gates 42(A) through 42(D). Although the word lines 1 and 2 are disclosed herein as being metal lines which are part of the first level metal layer, this embodiment was selected because metal is a better conductor than polycrystalline silicon of which the gate electrodes 1' and 2' are composed. However, it is within the scope of this invention to rely solely on the polycrystalline silicon gate electrodes 1' and 2' as the word lines for the array 10. Still further, although a single layer of polycrystalline silicon was disclosed, double layer polycrystalline silicon technologies would also be within the scope of the invention disclosed herein.

Although a specific embodiment of the invention has been disclosed, it will be understood by those having skill in the art that the foregoing and other changes in form and details may be made therein without departing from the spirit and the scope of the invention.

I claim:

1. In an FET read only memory array including a plurality of FET array devices accessed by a plurality of word lines and outputting stored signals on a plurality of bit lines, the improvement comprising:

a first one of said FET array devices having its source/drain path selectively connected between a first one of said bit lines and a first one of said word lines and its gate connected to said first word line, for selectively representing a first stored information state;

precharge means connected to said first bit line, for providing electrical charge to said first bit line;

said first word line providing a supplementary charge to said first bit line through said source/drain path of said first FET device in said first information state;

said first FET array device having its source/drain path selectively alternately connected between said first one of said bit lines and a reference potential, for selectively representing a second stored information state.

2. The apparatus of claim 1, which further comprises:

a reference conductor line disposed proximate to said first FET device in said array, for connection to said reference potential;

a conductor tab connected to the side of said source/drain path of said first FET device opposite from said first bit line and selectively connected to said word line to selectively store said first information state;

said conductor tab selectively alternately connected to said reference potential line to selectively store said second information state.

3. In an FET read only memory array including a plurality of FET array devices, each said array device being connected to one of a plurality of bit lines which are precharged to a first potential state during a first interval, each said array device being connected to one of a plurality of word lines which applies substantially said first potential during a second interval following said first interval, rendering the respective array device conductive, the improvement comprising:

a first one of said FET array devices having its source connected to a first one of said bit lines, having its gate connected to a first one of said word lines, and having its drain selectively connected to said first word line, representing a first binary state stored by said first array device, said first potential on said first word line serving to augment said precharged state of said first bit line during said second interval so that said first bit line remains at substantially said first potential during a sensing interval following said second interval;

a second one of said FET array devices having its drain connected to a second one of said bit lines, having its gate connected to a second one of said word lines, and having its source selectively connected to a second potential different from said first potential, representing a second binary state stored by said second array device, said second array device discharging said second bit line during said second interval so that said second bit line assumes substantially said second potential during said sensing interval;

whereby the effects of charge leaking from said bit lines can be minimized.

4. The apparatus of claim 3, which further comprises:

precharge means connected to said first bit line, for providing electrical charge to said first bit line;

said first word line providing a supplementary charge to said first bit line through the source/drain path of said first FET device when a first tab is connected to said first word line;

said second word line providing a supplementary charge to said first bit line through said source/drain path of said second FET device when a second tab is connected to said second word line.

5. The apparatus of claim 4, wherein said precharge means further comprising:

a first zero threshold voltage FET device connected between said first bit line and a second reference potential.

6. The apparatus of claim 5, which further comprises:

a second zero threshold voltage FET device connected between said first bit line and a sensing means, for outputting the voltage corresponding to the stored information state of said first or second FET devices in said array.

7. In an FET read-only memory array including a plurality of FET array devices accessed by a plurality of word lines and outputting stored signals on a plurality of bit lines, the improvement comprising:

a first one of said FET array devices having a source/drain path selectively connected between a first one of said bit lines and a first one of said work lines and its gate connected to said first word line, for selectively representing a first stored information state;

said first FET array device having its source/drain path selectively alternately connected between said first one of said bit lines and a reference potential, for selectively representing a second stored information state;

a first reference conductor line disposed proximate to said first FET device in said array, for connection to said reference potential;

a first conductor tab connected to the side of said source/drain path of said first FET device opposite from said first bit line and selectively connected to said first word line to selectively store said first information state;

said first conductor tab selectively alternately connected to said first reference potential line to selectively store said second information state;

a second one of said FET array devices having its source/drain path selectively connected between said first one of said bit lines and a second one of said word lines and its gate connected to said second work line, for selectively representing said first stored information state therein;

said second FET array device having its source/drain path selectively alternately connected between said first one of said bit lines and said reference potential, for selectively representing said second stored information state therein;

a second reference conductor line disposed proximate to said second FET device in said array, for connection to said reference potential;

a second conductor tab connected to the side of said source/drain path of said second FET device opposite from said first bit line and selectively connected to said second word line to selectively store said first information state therein;

said second conductor tab selectively alternately connected to said second reference potential line to selectively store said second information state in said second FET device.

8. The apparatus of claim 7, which further comprises:

a first region of a first conductivity type in a semiconductor substrate of a second conductivity type, for serving as the drain of said first FET device;

a second region of said first conductivity type in said substrate, spaced from said first region to define a first channel region therebetween, for serving as the source of said first FET device and the drain of said second FET device;

a third region of said first conductivity type in said substrate, spaced from said second region to define a second channel region therebetween, for serving as the source of said second FET device;

a first gate electrode located above said first channel region and connected to said first word line, for forming said first FET device;

a second gate electrode located above said second channel region and connected to said second word line, for forming said second FET device;

said first bit line connected to said second region of said first conductivity type;

said first tab connected to said first region of said first conductivity type, for selectively connecting to either said first word line or said first reference potential line;

said second tab connected to said third region of said first conductivity type, for selectively connecting to either said second word line or said second reference potential line.

* * * * *